United States Patent

Blohowiak et al.

(10) Patent No.: US 6,506,499 B1
(45) Date of Patent: Jan. 14, 2003

(54) SILICON-YTTRIUM SOL COATING OF METALS

(75) Inventors: Kay Y. Blohowiak, Issaquah, WA (US); Joseph H. Osborne, Tacoma, WA (US); Robert A. Anderson, Jr., Federal Way, WA (US); Tuan Q. Cao, Renton, WA (US)

(73) Assignee: The Boeing Company, Seattle, WA (US)

(*) Notice: Subject to any disclaimer, the term of this patent is extended or adjusted under 35 U.S.C. 154(b) by 0 days.

(21) Appl. No.: 09/392,061

(22) Filed: Sep. 8, 1999

Related U.S. Application Data

(63) Continuation-in-part of application No. 08/742,171, filed on Nov. 4, 1996, now Pat. No. 5,958,578.

(51) Int. Cl.$^7$ ................................................. B32B 9/04
(52) U.S. Cl. ............ 428/448; 106/287.13; 106/287.16; 134/29; 427/309; 427/327; 216/34; 428/447; 428/450; 516/89
(58) Field of Search .................... 134/29; 427/309; 427/327; 428/447, 450, 448; 516/89; 106/287.13, 287.16; 216/34

(56) References Cited

U.S. PATENT DOCUMENTS

| | | | |
|---|---|---|---|
| 3,935,349 A | 1/1976 | Terai et al. | |
| 4,028,085 A | 6/1977 | Thomas | |
| 4,118,540 A | 10/1978 | Amort et al. | |
| 4,439,239 A | 3/1984 | Greigger et al. | |
| 4,584,280 A | 4/1986 | Nanao et al. | |
| 4,634,686 A * | 1/1987 | Desmond et al. ........... 423/326 |
| 4,731,264 A | 3/1988 | Lin et al. | |
| 4,753,827 A | 6/1988 | Yoldas et al. | |
| 4,754,012 A | 6/1988 | Yoldas et al. | |
| 4,810,293 A | 3/1989 | Sano | |
| 4,929,278 A | 5/1990 | Ashley et al. | |
| 5,004,562 A | 4/1991 | Kissel | |
| 5,004,563 A | 4/1991 | Kissel | |
| 5,028,489 A | 7/1991 | Kissel | |
| 5,041,486 A | 8/1991 | Kissel | |
| 5,041,487 A | 8/1991 | Kissel | |
| 5,108,793 A | 4/1992 | van Ooij et al. | |
| 5,110,863 A | 5/1992 | Sugama | |
| 5,139,601 A | 8/1992 | Holmes-Farley et al. | |
| 5,158,605 A | 10/1992 | Kissel | |
| 5,166,248 A | 11/1992 | Kissel | |
| 5,175,027 A | 12/1992 | Holmes-Farley et al. | |
| 5,182,143 A | 1/1993 | Holmes-Farley et al. | |
| 5,200,237 A | 4/1993 | Sugama | |
| 5,242,714 A | 9/1993 | Steele et al. | |
| 5,261,955 A | 11/1993 | Nadkarni | |
| 5,292,549 A | 3/1994 | Van Ooij et al. | |
| 5,316,855 A | 5/1994 | Wang et al. | |
| 5,322,713 A | 6/1994 | van Ooij et al. | |
| 5,326,594 A | 7/1994 | Sabata et al. | |
| 5,433,941 A | 7/1995 | Patel | |
| 5,433,976 A | 7/1995 | van Ooij et al. | |
| 5,437,937 A * | 8/1995 | Cayless | |
| 5,558,701 A | 9/1996 | Patel | |
| 5,939,197 A * | 8/1999 | Blohowiak et al. | |

FOREIGN PATENT DOCUMENTS

JP 2001097742 A * 4/2001 ........... C03C/17/25

* cited by examiner

Primary Examiner—Robert Dawson
Assistant Examiner—Marc S Zimmer
(74) Attorney, Agent, or Firm—John C. Hammar

(57) ABSTRACT

A surface treatment, especially for titanium and aluminum alloys, forms a Si—Y sol-gel film covalently bonded on the metal surface to produce strong, durable adhesive bonds between the metal and an organic adhesive without using toxic chemicals and while significantly reducing or eliminating rinse water requirements of traditional anodizing or etching processes. The sol should produce bonds in a single application comparable in strength and performance to standard anodize controls. Parameters affecting performance include the sol composition, the ratio of silicon to yttrium in the sol, the ratio of other sol ingredients, the concentration of the sol, the carrier solvent, solution age, catalysts, surface pretreatment, application method, curing process, and primer used.

13 Claims, 3 Drawing Sheets

SILICON-YTTRIUM SOL COATING OF METALS

REFERENCE TO RELATED APPLICATIONS

The present application is a continuation-in-part application based upon U.S. patent application Ser. No. 08/742,171, filed Nov. 4, 1996, now U.S. Patent No. 5,958,578 which we incorporate by reference.

NOTICE OF GOVERNMENT RIGHTS

This invention was made with Government support under Contract F33615-93-C-5322 awarded by the Air Force. The Government has certain rights in this invention.

TECHNICAL FIELD

A silicon-yttrium sol-gel surface coating of the present invention is applied to metal, especially through a waterborne reactive sol, to provide a stable oxide surface that enhances organic matrix resin adhesion with the goal of achieving adhesion equivalent to conventional wet-chemical surface treatment methods.

BACKGROUND OF THE INVENTION

Conversion coatings for titanium, aluminum, or other metals are electrolytic or chemical films that promote adhesion between the metal and an organic adhesive resin, especially for adhesive bonding. Anodizing is a conventional process for making electrolytic films by immersing titanium or its alloys in chromic acid or an alkaline earth hydroxide or aluminum in chromic, sulfuric, or phosphoric acid. Anodizing produces a porous, microrough surface into which primer (a dilute solution of adhesive) can penetrate. Adhesion results primarily from mechanical interlocking between the rough surface and the primer. Chemical films include either a phosphate-fluoride conversion coating or films made with alkaline peroxide or other alkaline etchants for titanium substrates and alodine films for aluminum substrates.

Using strong acids or strong bases and toxic materials (such as chromates) in immersion tanks, these surface treatment processes present environmental concerns. They require significant amounts of water to rinse excess process solutions from the treated parts. The rinse water and spent process solutions must be treated to remove dissolved metals prior to their discharge or reuse. Removing the metals generates additional hazardous wastes that are challenging to cleanup and to dispose. They greatly increase the cost of using the conventional wet-chemical processes. A process that will produce adhesive bonds with equivalent strength and environmental durability to these standard processes without generating significant hazardous wastes while eliminating the use of hazardous or toxic materials would greatly enhance the state-of-the-art. The present invention is one such process. In addition, the sol of the present invention can be applied by spraying rather than by immersion. It, therefore, is more readily adapted to use for field repair and maintenance.

Surface anodizing chemically modifies the surface of a metal to provide a controlled oxide surface morphology favorable to receive additional protective coatings, such as primers and finish paints. The surface oxides function as adhesion coupling agents for holding the paint lacquer, an organic adhesive, or an organic matrix resin, depending on the application. Anodizing improves adhesion between bonded metals, or between the metal and a fiber-reinforced composite in hybrid laminates, like those described in U.S. Pat. Nos. 4,489,123 or 5,866,272. We incorporate these patents by reference. Structural hybrid laminates have strengths comparable to monolithic metal, and have better overall properties than the metal because of the composite layers. At higher temperatures (like those anticipated for extended supersonic flight), conventional anodized treatments are inadequate in addition to being environmentally unfriendly. The thick oxide layers that anodizing produces become unstable at elevated temperatures. The oxide layer dissolves into the base metal to produce surface suboxides and an unstable interfacial layer.

Obtaining the proper interface for the organic resin at the surface of the metal is an area of concern that has been the focus of considerable research. For example, cobalt-based surface treatments are described in U.S. Pat. Nos. 5,298,092; 5,378,293; 5,411,606; 5,415,687; 5,468,307; 5,472,524; 5,487,949; and 5,551,994. U.S. Pat. Nos. 4,894,127 describes boric acid -sulfuric acid anodizing of aluminum.

Resins bond to a surface through bonding sites using covalent bonds, hydrogen bonds, or van der Waals forces. A coupling agent between the resin and metal often is required to improve adhesion. The present invention improves adhesion by placing a sol-gel film at the interface between the metal and resin. In effect, the sol-gel provides a metal-to-resin gradient through a monolayer of organometallic coupling agents. Generally we use a mixture of metals in the coupling agents. The organometallic compounds in our earlier applications, like the sols described in U.S. Pat. No. 5,849,110, preferably used zirconium and silicon organometallic compounds to interact with, react with, or bond to the metal surface. The Zr and Si also form a network in the sol-gel coating itself. Some mechanical interaction may result from the surface porosity and microstructure. The organic portion of the organometallic compounds here and in our previous sols usually has a reactive functional group for covalently bonding with the adhesive or matrix resin. Our organometallic coupling agent preferably bonds covalently with the metal and covalently with the resin. Thus, the sol-gel process has an oriented metal-to-resin gradient on the surface.

Situations involving extended exposure to hot/wet conditions (where polyimide adhesives hold promise) do not allow the adhesion surface preparation to continue to be the standard anodize processes or oxide surface preparations, especially for titanium. At high temperatures, the solubility of oxygen in titanium is high and the oxide layer simply dissolves with the oxygen permeating through the base metal. The result is interfacial failure at the metal-adhesive interface. To alleviate this type of bond failure, the surface oxygen needs to be tied up in a stronger bond that will not dissociate in bonding or during operation of the system. A zirconate-silicate sol coating of was useful at these extended hot/wet conditions because the Zr—O bond that forms between the coating and the metal surface is stronger than a Ti—O bond. Both Zr—O and Ti—O bonds are stronger than Si—O bonds. The higher bond strength prevents dissolution of the oxide layer, so the Zr component in our sol coating functions as an oxygen diffusion barrier. In the present invention, we use yttrium, in addition to or as a replacement for the Zr. Yttrium produces high strength oxide bonds that function as an oxygen diffusion barrier. The high cost of these compounds, however, dictates that they be used sparingly. Hence, we have developed another coating to produce the desired metal-to-resin gradient needed for good adhesion in structural adhesive bonds, hybrid laminates, or paint adhesion applications. The sol-gel coating integrates the barrier function of the Y (or, perhaps, Ce or La) with an organosilicate network desirable for superior bonding performance.

SUMMARY OF THE INVENTION

The present invention is a surface treatment for metal surfaces, especially aluminum or titanium alloys, using organometallics containing silicon and yttrium to produce a Si—Y sol-gel film surface coating, similar to the Zr—Si sol-gels of our earlier patents, suitable as an interface to improve adhesion between the metal surface and an organic matrix resin or adhesive. The sol-gel film or sol coating may improve corrosion resistance to a limited degree. It promotes adhesion of an organic resin to the metal through a hybrid organometallic coupling agent at the metal surface in a manner similar to our silicon-zirconium sol-gels. The sol is preferably a dilute solution of an yttrium alkoxide, such as yttrium propoxide or yttrium methoxyethoxide, and an organosilane coupling agent, such as aminophenyltrimethoxysilane.

The sol-gel film is applied by immersing, spraying, or drenching the metal in or with the Si-Y sol without rinsing. Key to the sol-gel film are bonding sites with the metal and separate sites to bond (or otherwise affiliate) with the resin. The sol-gel film produces a gradient changing from the characteristics of metal to those of organic resins. Good adhesion results from clean, active metal surfaces with sol coatings that contain the organometallic coupling agents in the proper orientation. After application, the sol coating is dried at ambient temperature or, more commonly, heated to a temperature between ambient and 250° F. to complete the sol-gel film formation. The atomic ratio of Si:Y preferably ranges from 10:1 to 36:1, so these sols have a much higher concentration of Si relative to the other organometallic component than the Si—Zr sol. The Si—Y sol has utility and performance similar to the Si—Zr sol, at least for titanium substrates.

Ideally, covalent bonding occurs between the metal surface and an yttrium compound in the sol. Successful bonding requires a clean and chemically active metal surface. The strength and durability of the sol coating depends upon chemical and micro-mechanical interactions at the surface involving, for example, the metal's porosity and microstructure and on the susceptibility of the sol coating to rehydrate. Our preferred sol coating should provide high temperature surface stability for paint adhesion, adhesive bonding, or fabrication of structurally superior hybrid laminates.

DETAILED DESCRIPTION

Figure 1:
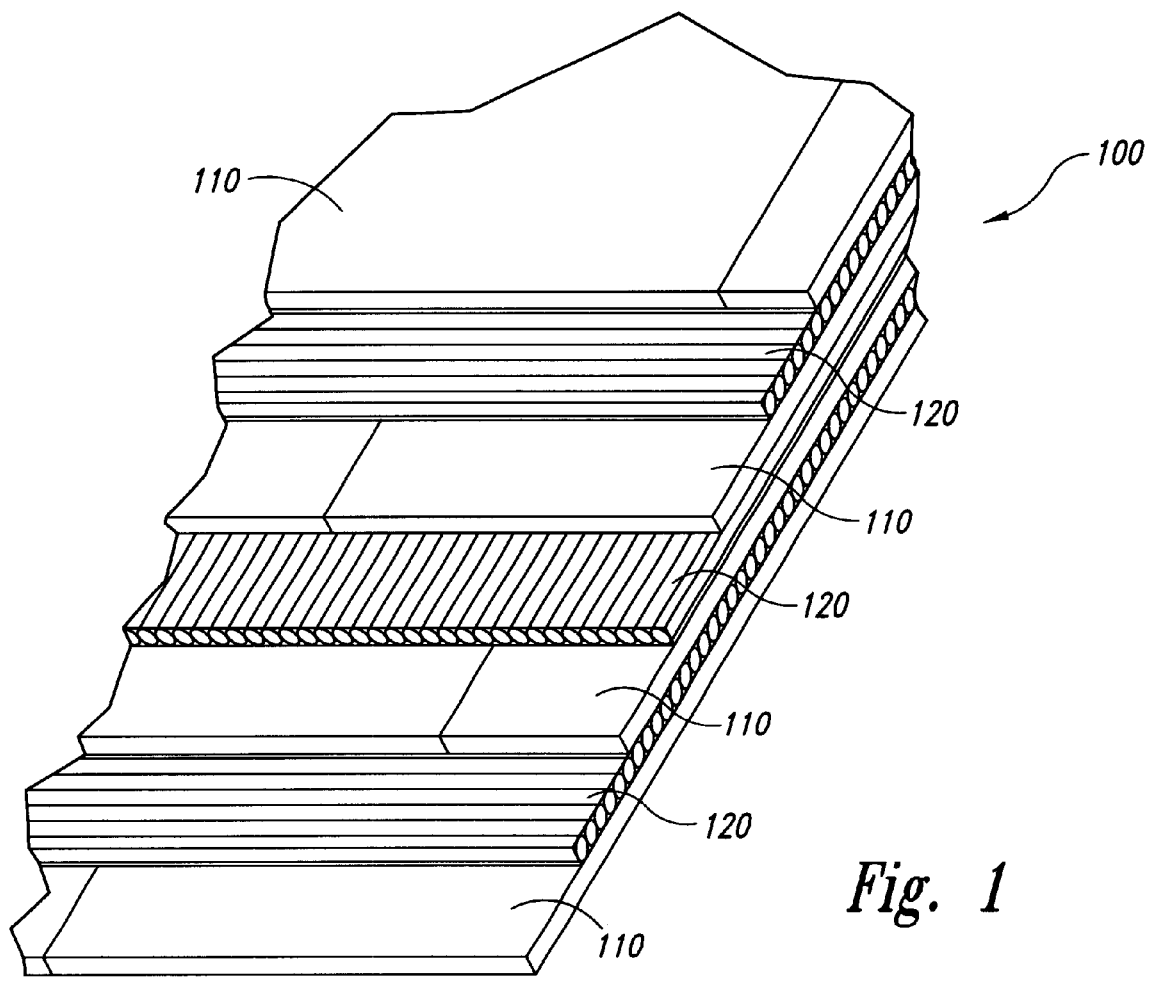
FIG. 1 is an isometric view of a typical hybrid laminate.
Figure 2:
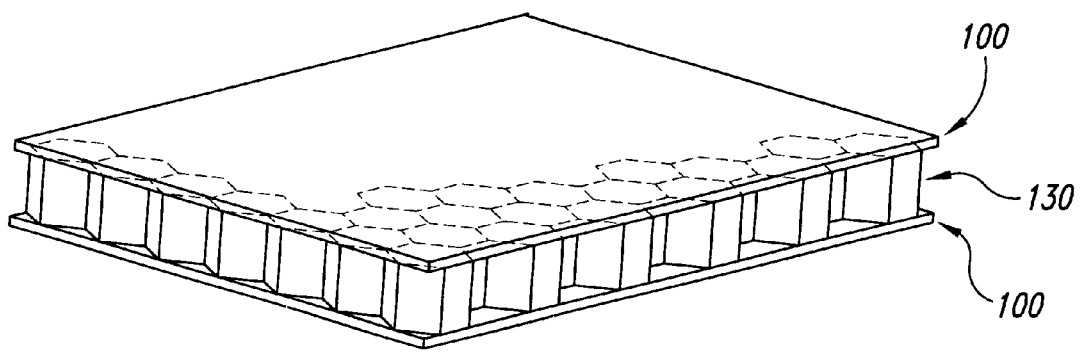
FIG. 2 is an isometric view of a sandwich panel having hybrid laminate skins and a honeycomb core as typically used in an aerospace skin panel.
Figure 3:
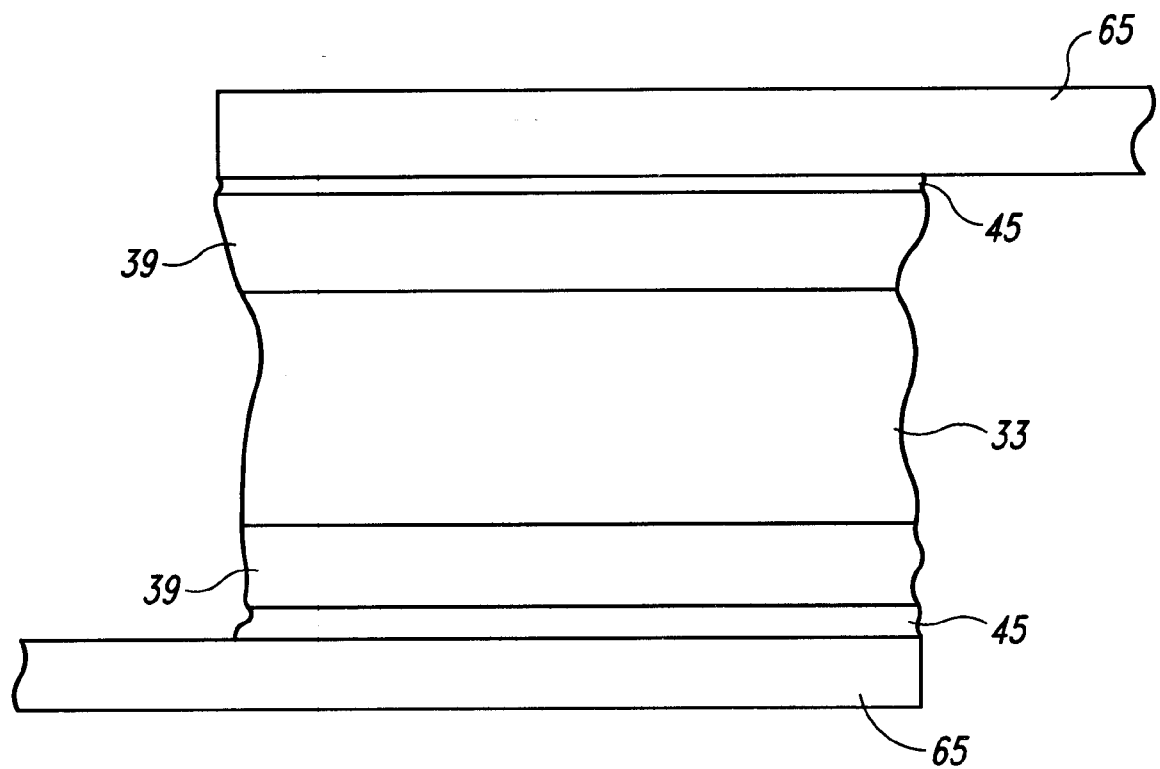
FIG. 3 is a sectional view showing the typical layers in a sol coated metal product, here illustrated as a lap joint having an adhesive bond.
Figure 4:
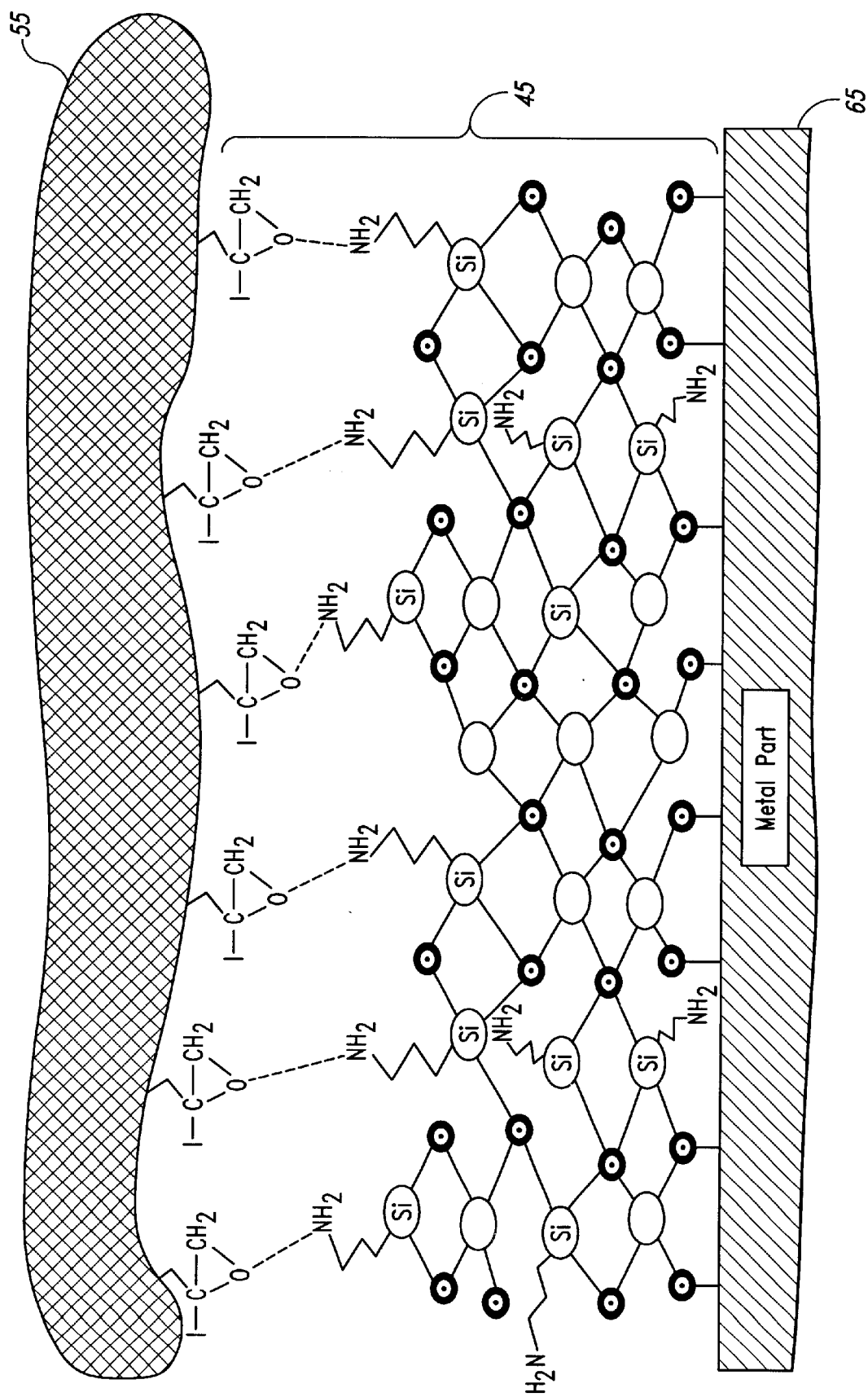
FIG. 4 is a schematic sectional view of a sol coating for paint adhesion showing the interfaces at the metal and resin interfaces and the peptizing within the sol coating between the mixed metals.

We will first discuss some generally applicable aspects of our Si—Y sol and the sol-gel coating it produces. We believe that Si—Y sol-gel films will perform similar to Si—Zr sol-gel films, so we include some Si—Zr test data here.

1. The Sol Coating

Sol coating of metals achieves resin-to-substrate bonding via chemical linkages (covalent bonds, hydrogen bonds, or van der Waals forces) while minimizing environmental impacts otherwise caused by the traditional use of highly diluted hazardous metals. U.S. Pat. No. 5,849,110 describes making a mixed metal Zr—Si sol coating (also called a sol-gel film) on the metal using an organozirconium compound (such as tetra-n-propoxyzirconium) to bond covalently to the metal through the Zr and an organosilane (such as 3-glycidoxypropyltrimethoxysilane) to bond covalently to the organic primer, adhesive, or resin (with an acetic acid catalyst in water-based formulations as a catalyst and Zr stabilizer). The present invention uses yttrium compounds in place of the organozirconium compound (typically a zirconium alkoxide).

When the sol-gel film is successful, the typical failure mode for adhesively bonded specimens in a hot/wet environment is cohesive failure in the organic adhesive layer. In such cases, the Si—Zr sol-gel film is stronger than the bulk adhesive, so the adhesive bond is as strong as possible.

In the present invention, Si—Y sol-gel binder coatings about 20 - 500 nm thick produce a gradient from the metallic surface through a hybrid organometallic sol-gel film to the adhesive. Bond strength and durability in one preferred sol coating is increased by including organosilanes and organozirconium compounds. The organosilanes preferably covalently bond to or otherwise associate with the organic adhesive resin or primer. Ideally, covalent bonding also occurs at the interface between the sol-gel and metal surface. Mechanical interactions may also play a role depending on the design (i.e., porosity, microstructure) of the sol coating. Durability of the sol-gel film in humid conditions depends on whether the film rehydrates.

The term "sol-gel," a contraction of solution-gelation, refers to a series of reactions where a soluble metal species (typically a metal alkoxide or metal salt) hydrolyzes to form a metal hydroxide. The soluble metal species usually contain organic ligands tailored to correspond with the resin in the bonded structure. The metal hydroxides condense (peptize) in solution to form an hybrid organic/inorganic polymer. Depending on reaction conditions, the metal polymers may condense to colloidal particles or they may grow to form a network gel. The ratio of organics to inorganics in the polymer matrix is controlled to maximize performance for a particular application.

Many metals are known to undergo sol-gel reactions. Silicon and aluminum sol-gel systems have been studied extensively. Representative sol-gel hydrolysis and condensation reactions, using silicon as an example, are shown in equations (1) and (2).

$$Si(OEt)_4 + 2H_2O \rightarrow Si(OH)_4 + 4EtOH \qquad \text{hydrolysis (1)}$$

$$Si(OH)_4 \rightarrow SiO_2 + 2H_2O \qquad \text{condensation (2)}$$

wherein Et is $CH_3CH_2$—. The hydrolysis and condensation reactions can be complete resulting in complete conversion into the metal oxide or a hydrous metal hydroxide. They can be partial, leaving more of the alkoxide functionalities in the finished gel. Depending upon the reaction conditions, reactions (1) and (2) can produce discrete oxide particulates, as demonstrated in the synthesis of nanoscale particles, or they can form a network gel, which can be exploited in film formation. The solubility of the resulting gel in a solvent will depend upon the size of the particles and degree of network formation.

We prefer a clean and chemically active metal surface to bond our Si:Y sol-gel film from the sol by spraying, immersing, or drenching. Cleaning is a key factor toward obtaining good adhesion. If the surface is dirty, bonding is blocked by the dirt or occurs between the sol and the dirt rather than between the sol and the surface. Obtaining a chemically active surface is not trivial. Titanium produces a passive oxide surface. A bare, pure titanium surface will immediately oxidize in air or dry oxygen to form a barrier titanium oxide film which has a thickness of 2–4 nm (20–40A). Titanium surface oxides do not hydrolyze as readily as aluminum surface oxides to form active metal hydroxides. Water will, however, chemisorb or physisorb onto the surface of the titanium oxide. Aluminum oxidizes as quickly, or more quickly in air.

$HNO_3$—HF etching of titanium alloys removes $TiO_2$ alpha case, but creates a smooth surface to which it is difficult to bond. Traditional alkaline etches like TURCO 5578 or OAKITE 160, produce a roughened surface better suited for adhesive bonding, but produce a tenacious smut layer. The smut causes adhesion to be reduced dramatically. Extended soaking in hot HNO3 after the alkaline etch still leaves some smut. In our preferred process, we clean and rinse the surface, etch with HNO3—HF, rinse again, and alkaline etch. Again after another rinse, we desmut the surface with BOECLENE once or in multiple stages to produce a clean and active surface best suited for adhesive bonding through the sol coating of the present invention.

Our model of the formation of a sol-gel film on titanium involves Lewis acid/base interaction of a hydrolyzed yttrium alkoxide, an organosilane, or both in the sol with the titanium oxide surface. This interaction is possibly assisted by chemisorbed water to cause the formation of a coupled Y—O—Ti or Si—O—Ti linkage and a new Ti—OH bond on the surface. The ability of the metal alkoxides to bond covalently with the metal surface most likely requires more energy in the case of titanium than aluminum. Complete coupling and formation of covalent bonds with titanium alloys may not occur until the part reaches higher temperatures, such as they usually experience during adhesive curing.

Reaction conditions (for example, concentration of reagents and catalyst type) control the relative rates of the hydrolysis and condensation reactions. Sol-gel solutions can be prepared which readily form thin films or which condense to fine colloidal particles. Starting materials and reaction conditions can produce films with morphology similar to surface coatings achieved with anodize and etch processes. Density, porosity, and microstructure can be tailored by controlling the chemistry of the sol.

Sol-gel condensation reactions are affected by the acid -base character of the metal /oxide surface. The isoelectronic point (IEP, a measure of surface pH) for titanium is more acidic (IEP=6.0) than an aluminum surface (IEP=9.2), which generally dictates changes in the surface chemistry of the metal with the sol.

We have tested Si:Y sols in the range from 10:1 to 80:1 and, typically, 10:1 to 36:1 atomic ratio of Si:Y. Table 1 shows results for a sol having 20:1 Si:Y wherein the Si was aminophenyltrimethoxysilane and constituted 3 % of the total sol composition by weight. The sol has a pH around 7.5. The absolute ratio of Si:Y needs further study, but the 10:1 to 36:1 range likely will cover the practical sols. Yttrium provides a sol that is more stable thermally and hydrolytically, but a higher concentration of yttrium might reduce the suitability of the sol to coat titanium substrates. The sol was aged for two hours, applied to a Ti-6Al-4V substrate, and then heated to 450° F. for one hour to cure it. The test specimens were primed with Cytec BR-X5 and bonded together with Cytec FM-5 adhesive with a one hour cure at 485° F. followed by a one hour post-cure at 700° F. Aging and hot/wet results are shown in Tables 2 and 3.

TABLE 1

Initial Properties of Si:Y Sol-Gel film

| Conditions | Test Temp. | Ult. Stress | % Coh | Std. Dev. |
| --- | --- | --- | --- | --- |
| As-bonded | RT | 8230 | 93 | 426 |
| As-bonded | −65° F. | 9238 | 91 | 264 |
| As-bonded | 350° F. | 5848 | 95 | 157 |
| 750° F. PC | RT | 8247 | 93 | 53 |
| 3-day boil | RT | 4031 | 50 | 211 |
| 750° F. PC & 3-day boil | RT | 5333 | 73 | 954 |

"RT" means "room temperature"

TABLE 2

Aging Data for Si:Y Sol-Gel Adhesion Test Coupons

| | 350° F. | | | 400° F. | | |
| --- | --- | --- | --- | --- | --- | --- |
| Hours | Ult. Stress | Std. Dev | % coh | Ult. Stress | Std. Dev | % Coh |
| 0 | 8230 | 426 | 93 | 8230 | 426 | 93 |
| 1000 | 8873 | 279 | 97 | 8186 | 382 | 97 |
| 2000 | 9360 | 208 | 97 | 8598 | 186 | 95 |

Specimens in each conditioning group were from the same panel. The 750° F. and the 3-day water boil specimens were removed from the aging groups undergoing testing at 400° F. %coh means percent cohesive failure.

TABLE 3

Hot/wet test results for Si:Y sol-gel films at 160° F.

| Ult. Stress | Std. Dev. | % coh |
| --- | --- | --- |
| 8230 | 426 | 93 |
| 6043 | 670 | 52 |
| 5672 | 106 | 62 |

The data show that the bonded system having a sol-gel surface treatment is stable at 350° F. and 450° F. and experience little degradation at 160° F. in wet conditions. Therefore, the Si—Y sol appears to be a suitable alternative to our Si—Zr sol.

This Si—Y sol included 3 wt% cellosolve with 20 % isopropanol in water. We believe that aging of the sol can extend 2–24 hours prior to its application. The sol-gel curing time might extend 1–4 hours. The preferred titanium substrates are Ti-6A1-4V and Ti-15-3-3-3-3. We believe that the Si—Y sol is also suitable for aerospace aluminum alloys.

A water-based system for the sol alleviates many of the flammability, safety, toxicity, and environmental concerns associated with the process when the sol is alcohol-based. We chose a glycidoxysilane (an epoxy ) for the Si—Zr sol because of its stability in solution and its ability to crosslink with common, aerospace epoxy or urethane adhesives. The silane is acid -base neutral (pH≈7.0) so its presence in the sol mixture does not increase the relative hydrolysis and condensation rates of the alkoxides. Sols including the organosilanes are relatively easy to prepare and to apply with reproducible results. The same considerations apply to selection of the silane and organoyttrium compound in the Si—Y system. For polyimides (including bismaleimides), we usually replace GTMS with an aminoalkylsilane or an aminoarylsilane to match the silane coupling chemistry with the resin system. In these sols which operate best at a pH 8–9, we add ammonium hydroxide in small amounts to disrupt the Zr-acetate complex that otherwise forms.

The Si-Y sol can include yttrium acetate trihydrate or other hydrates, yttrium 2-ethylhexanoate, i-propoxyyttrium, methoxyethoxyyttrium, or yttrium nitrate. We prefer to use yttrium propoxide or yttrium methoxyethoxide.

The organozirconium in the Si—Zr films serves to minimize the diffusion of oxygen to the surface and to stabilize the metal-resin interface. As a variation to the sol coating process, a stabilizer might be applied to the surface to form a barrier film prior to applying the hybrid organometallic sol to form the sol-gel film. Yttrium replaces Zr in these films in the present invention.

Alcohol-based sols allow us to precisely control the amount of hydrolysis and we prefer to use them for the Si—Y sols. Optimization of the water-based system for Si—Zr sols, however, actually yielded better hot/wet durability results than the alcohol-based system, as demonstrated by comparing similar alcohol and water-based coatings.

Aging of the sol, which we call the "induction time," is another important factor in using our sols. Complete hydrolysis and condensation of the organometallic in the sol-gel film is important to develop a hydrolytically stable metal oxide film in the metal. The presence of hydrolyzable alkoxides in the sol-gel film will have two adverse effects. First, every residual alkoxide represents an incomplete condensation site between the metal and the coupling agents. Incomplete condensation, therefore, decreases the ultimate bond strength of the sol-gel film. Second, in a humid environment, these alkoxide residues can hydrolyze. The structural changes accompanying hydrolysis cause stress in the sol-gel film which, we believe, promotes failure to occur within the sol-gel film or at one of the interfaces (metal/film or film/primer or adhesive).

Aging is a function of the rates of the hydrolysis reaction of the zirconium alkoxides and the organosilane. Tetra-n-propoxyzirconium reacts more rapidly with water or other active hydrogens than the silane. The zirconate hydrolyzes rapidly using ambient moisture and condenses with itself or with absorbed water on the titanium surface. If not properly controlled, this zirconate hydrolysis self-condensation reaction can produce insoluble zirconium oxyhydroxides which will precipitate and become nonreactive.

If, however, the Si—Zr sol is applied too short a time after being made, the organosilane may not be fully hydrolyzed. As the sol ages, the hydrolyzed silicon and zirconium components may condense among themselves, forming oligomers and networks. These networks will eventually become visible to the naked eye and become insoluble. The ideal solution age is at the point that the zirconium and silicon are hydrolyzed sufficiently that zirconium and silicon react with the metal surface. At this point, generally some metal polymers and networks have formed in the sol and they will give the sol-gel film some structure. A similar phenomena occurs because of the different rates that the organosilane and yttrium alkoxide hydrolyze in the sols of the present invention.

We made the zirconium and silicon components hydrolyze on a similar time scale by mixing the zirconium alkoxide with glacial acetic acid to stabilize the fast reacting four-coordinate zirconate center and to enable a water-based system. This mixing effectively changed the geometric and electronic nature of the zirconium component. We use the minimum amount of acetic acid necessary to form the zirconium-acetic acid complex. Other organic acids, like citric acid, can be substituted for the acetic acid. We might also use glycols, ethoxyethanol, $H_2N-CH_2-CH_2-OH$, or the like. Similar adjustment of the hydrolysis rates might be required in the Si—Y system.

Extended X-ray fine structure (EXAFS) analysis to interpret the X-ray absorption near edge structures (XANES) identified zirconium polymers in the sol where the terminal alkoxy groups are substituted by acetyl groups. Bridging alkoxide groups existed in an equilibrium placing the Zr-atom in a 6-fold coordination. The zirconium thereafter hydrolyzed more slowly, putting it on a hydrolysis time scale similar to the preferred organosilane. IR measurements indicated that the acetate coordination was monodentate.

The amount of acetic acid added to a Si—Zr sol plays a major role in the Si—Zr sol because the acetic acid aid functions as a catalyst for the hydrolysis and a stabilizer for the zirconium complex. A similar additive might be used in the Si—Y system.

In our Si—Zr sol tests, we cleaned the metal surface using abrasive blasting or acid etching with $HNO_3$-HF in both liquid and paste form. Since the Si—Zr sol reacts directly with chemical moieties on the substrate surface, adhesion is sensitive to surface precleaning. Residues or smut formation resulting from the cleaning processes can drastically effect the adhesive bond performance, because residues and smut are relatively loosely adhered to the surface.

A TURCO 5578 alkaline etch of the metal surface produced a mat finish, similar to an anodize, resulting from the formation of a microrough surface. This pretreatment showed superior hot/wet durability for the Zr—Si system and we expect similar results for the Si—Y system of the present invention.

The use of conventional dry grit blasting as a surface preparation pretreatment prior to sol coating has both advantages and disadvantages depending on the type of metal surface to be treated and the environment in which the process is being carried out. Grit blasting produced the highest strength and most durable adhesive bonds of the tested surface treatments for the Zr—Si system. Grit blasting should work well on thicker panels or parts requiring limited amounts of blasting. Care must be taken not to warp the panel as the result of stresses introduced during the blasting.

There are numerous disadvantages associated with grit blasting. First, it cannot be used on titanium foil or honeycomb core without serious risk of damage to the substrate or on fatigue critical parts. Blasting produces holes in the metal in these cases. Complex parts might be difficult to access to produce a uniform finish. Although the equipment and materials required for grit blasting are not exotic, they may not be available at sites where sol coatings could otherwise easily be applied.

We blasted titanium panels with different grit sizes of alumina #46 grit, #180 grit, and a very fine polishing alumina with an average size of 50 micrometers. All of the grit sizes evenly abraded the surface and yielded a uniform matte finish. Surface roughness was measured using a surface profilometer, using a half inch traverse and a 0.03 cutoff. The average roughness (Ra) was 144 microinches for the #46 grit panel, 30 for the #180 grit panel, and 22 for the panel blasted with the fine grit. Surface contaminants, like heavy greases or oils, were not easily removed during grit blasting using the fine alumina powders. The grit was simply imbedded into the contaminant and lost all velocity. The finest alumina grit was too friable and broke down quickly during the blasting process. After a certain time period, the very fine particles were no longer effective at abrading the surface. The dust was hard to contain within the sandblasting apparatus.

We used scanning Auger microscopy to analyze the panels after blasting. The effective oxide thickness of the non-blasted area was measured at approximately 200 Å, while the total structured surface was about 2000 Å for that of the blasted area. Bright particles were observed imbedded into the surface and were verified to contain primarily aluminum and oxygen, most likely as $Al_2O_3$. Acid etching removed the embedded alumina particles from the titanium surface only after the titanium had been etched away and removed from around the particles. Unfortunately, post-blasting etching also removed the roughened texture of the surface. We do not know the role alumina particles play, if any, in adhesion to the grit blasted surface.

No single surface pretreatment appears to provide optimum results over the full range of substrates. Various combinations of acid etch and alkaline etch treatments apparently work well on certain alloys, but questions remain as to whether they introduce hydrogen embrittlement problems for Ti foil or honeycomb core substrates. Our preferred cleaning and activation processes are prewetting, alkaline etching to activate the surface, and BOECLENE or other acid etching (i.e. $H_2SO_4$—$HNO_3$-ammonium bifluoride) to desmut titanium alloys.

The drying cycle for the sol coating is another significant processing parameter to controlling adhesive bond performance. The drying cycle includes: (1) ambient air flash time after application of the sol; (2) oven dry time at temperature; and (3) storage time in air thereafter prior to application of the primer.

Preferred zirconium compounds for making the Si—Zr sol are of the general formula $(R—O)_4 Zr$ wherein R is lower aliphatic having 2–5 carbon atoms, especially normal aliphatic (alkyl) groups, and, preferably, tetra-n-propoxyzirconium, because of its being readily available commercially. Branched aliphatic, alicyclic, or aryl groups should also perform satisfactorily. For applications involving extended exposure to hot/wet conditions, we want the organo moiety on the zirconium to have thermo-oxidative stability.

The preferred organosilane compounds include:
-aminopropyltriethoxysilane,
3-glycidoxypropyltrimethoxysilane,
p-aminophenylsilane,
allyltrimethoxysilane,
n-(2-aminoethyl)-3-aminopropyltrimethoxysilane,
3-aminopropyltriethoxysilane,
3-aminopropyltrimethoxysilane,
3-glycidoxypropyldiisopropylethoxysilane,
(3-glycidoxypropyl)methyldiethoxysilane,
3-glycidoxypropyltrimethoxysilane,
3-mercaptopropyltrimethoxysilane,
3-mercaptopropyltriethoxysilane,
3-methacryloxypropylmethyldiethoxysilane,
3-methacryloxypropylmethyldimethoxysilane,
3-methacryloxypropyltrimethoxysilane,
n-phenylaminopropyltrimethoxysilane,
vinylmethyldiethoxysilane,
vinyltriethoxysilane, or
vinyltrimethoxysilane.

The organo moiety preferably is aliphatic or alicyclic, and generally is a lower n-alkoxy moiety having 2–5 carbon atoms. The organosilane includes typically an epoxy group (for bonding to epoxy or urethane resins or adhesives) or a primary amine (for bonding to polyimide resins or adhesives). We prefer aminophenyltrimethoxysilane in the Si:Y sols.

If the sols are alcohol-based, the preferred alcohols are ethanol, isopropanol, or another lower aliphatic alcohol. For Si—Y sols, we prefer isopropanol usually as about 20% of the solvent in water.

Sols of the present invention can be used to make sol-gel films on the following aluminum and titanium alloys: Al2024; Al7075; Ti-6-4; Ti-15-3-3-3; Ti-6-2-2-2-2; and Ti-3-2.5. The sol coating method can also be used with copper or ferrous substrates, including stainless steel or an Inconel alloy.

2. Hybrid Laminates

Sol coated metals are useful in hybrid laminates like those described in U.S. Pat. Nos. 4,489,123 or 5,866,272. These hybrid laminates are candidates for use as aircraft skin panels and other structural applications in subsonic or, especially, supersonic aircraft. The utility of these hybrid laminates hinges on a sound, strong adhesive bond between the metal and resin. The sol coating of the present invention provides a high strength adhesion interface at relatively low cost compared with conventional alternatives in a reasonably simple manufacturing process.

Hybrid laminates should have a high modulus (absolute strength) and be fatigue resistant so that they have long life. They should exhibit thermomechanical and thermo-oxidative stability, especially in hot/wet conditions. They should have a high strength-to-weight ratio while having a relatively low density as compared to a solid (monolithic) metal. They should be damage resistant and damage tolerant, but they should dent like metal to visibly show damaged areas long before the damage results in actual failure of the part. They should be resistant to jet fuel and aerospace solvents. Finally, they should be resistant to crack growth, preferably slower than monolithic titanium.

The hybrid laminates generally have alternating layers of titanium alloy foil 110 and a fiber-reinforced organic matrix composite 120 (FIG. 1). The foil typically is sol coated to enhance adhesion between the foil and the matrix resin of the composite (and any intervening primers or adhesives). The foil typically is about 0.01–0.003 inches thick (3–10 mils) of β- annealed titanium alloy having a yield strain of greater than about 1%. The composite typically is a polyimide reinforced with high strength carbon fibers. The polyimide is an advanced thermoplastic or thermosetting resin capable of extended exposure to elevated temperatures in excess of 350° F., such as BMI, PETI-5, or a Lubowitz and Sheppard polyimide. The composite is one or more plies to provide a thickness between the adjacent foils of about 0.005–0.03 inches (5–30 mils). Other configurations of the hybrid laminates, like metal reinforced resin composites, might be used.

The preferred composite is formed from a prepreg in the form of a tow, tape, or woven fabric of continuous, reinforcing fibers coated with a resin to form a continuous strip. Typically, we use a unidirectional tape. The fibers make up from about 50 to 70 volume percent of the resin and fibers when the fiber is carbon, and from about 40 to about 60 volume percent when the fiber is boron. When a mixture of carbon and boron fibers is used, total fiber volume is in the range 75 to 80 volume percent. The plies may be oriented to adjust the properties of the resulting composite, such as 0°/90° or 0°/−45°/+45°/0°, or the like.

Hybrid laminates of this type exhibit high open-hole tensile strength and high compressive strength, thereby facilitating mechanical joining of adjacent parts in the aircraft structure through fasteners. The laminates might also include Z-pin reinforcement in the composite layers or through the entire thickness of the laminate. Z-pinning techniques are described in U.S. patent applications Ser. Nos. 08/582,297 and 08/658,927; and U.S. Pat. No. 5,862, 975; 5,736,222; and 5,869,165, which we incorporate by reference.

The hybrid laminates can be used in skin panels on fuselage sections, wing sections, strakes, vertical and horizontal stabilizers, and the like. The laminates are generally bonded as the skins 100 of sandwich panels that preferably are symmetrical and include a central core 130 of titanium alloy honeycomb, phenolic honeycomb, paper honeycomb, or the like (FIG. 1), depending on the desired application of sandwich panel. Sandwich panels are a low density (lightweight), high strength, high modulus, tailorable structure that has exceptional fatigue resistance and excellent thermal-mechanical endurance properties.

The hybrid laminates are also resistant to zone 1 lightning strikes because of the outer titanium foil.

Outer metal layers protect the underlying composite from the most severe hot/wet conditions and the cleaning solvents that will be experienced during the service life of the product, especially if it is used on supersonic aircraft.

To prepare hybrid laminates, generally we pretreat cleaned, β-annealed Ti-6A1-4V alloy foils in various concentrations (i.e. 20%, 60%, or 80 %) of TURCO 5578 alkaline etchant (supplied by Atochem, Inc. of Westminster, Calif.). After water rinsing the foils are immersed in 35 vol % $HNO_3$—HF etchant at 140° F. to desmut the foil, they are rinsed again, and, then, are sol coated in accordance with the present invention.

For the strongest interaction between the sol-gel film and the composite, we prefer that the organic moiety of the silane correspond with the characteristics of the resin. For example, PETI-5 is a PMR-type or preimidized, relatively low molecular weight resin prepreg having terminal or pendant phenylethynyl groups to promote crosslinking and chain extension during resin cure. Therefore, the silane coupling group might include a reactive functionality, such as an active primary amine; an anhydride, carboxylic acid, or an equivalent; or even a phenylethynyl group, to promote covalent bonding between the sol coating and the resin. The organic moiety might simply be an aliphatic lower alkyl moiety to provide a resin-philic surface to which the resin will wet or have affinity for to provide adhesion without producing covalent bonds between the organosilane coupling agent and the resin. The aliphatic moiety, however, would still provide hydrogen atoms for hydrogen bonding with the numerous heteroatoms (oxygen) in the cured PETI - 5 imide. If the resin includes a nadic or maleic crosslinking functionality, as Lubowitz and Sheppard suggest or as occurs in bismaleimides, then the organosilane coupling agent might include the same nadic or maleic crosslinking functionality or an amine, —OH, or —SH terminal group for covalent bonding through capping extension or the Michael's addition across the active unsaturated carbon-carbon bond in the resin's cap. For higher temperature applications, we recommend using an aromatic organometallics since these compounds should have higher thermo-oxidative stability.

Knowing which resin will provide the best overall performance in the hybrid laminates remains for further testing, as does selection of the absolute type of resin and its formulation. Ideally, the resin is easy to process because it has few adverse aging consequences from extended exposure to ambient conditions common during fiber placement. The resin prepregs should also have long shelf lives. Alternately, the resin should be suitable for in situ consolidation while being placed on the foil.

Tows of mixed carbon and boron fibers suitable for these hybrid laminates are sold under the tradename HYBOR by Textron Specialty Materials of Lowell, Mass. Boron fibers provide high compressive strength, while carbon fibers provide high tensile strength. The preferred boron fiber has the smallest diameter (typically 4–7 mils) and the highest tensile elongation.

Hybrid laminates can have open-hole tensile strengths of about 150–350 ksi and an ultimate tensile strength in excess of $2 \times 10^6 psi /lb/in^3$.

The sol coating can be applied to advantage on sheet, plate, foil, or honeycomb. While described primarily with reference to Ti, the sol coating is also useful on Al, Cu, or Fe pure metals or alloys. One application for copper includes coating a susceptor mesh or foil used in thermoplastically welded composite structures. Another application for coated copper includes protecting the metallic interlayers in multichip modules or multilayer chip module packaging. Suitable ferrous alloys are mild steel, cold rolled steel, stainless steel, or high temperature alloys, such as the nickel-iron alloys in the INCONEL family.

A presently preferred surface pretreatment for the metal includes the steps outlined in Table 4.

TABLE 4

| Pretreatment Process Steps | Temp | Time |
|---|---|---|
| Aqueous Degrease with Super Bee per BAC 5763 (optional) | 150 ± 5F | 20 to 30 minutes |
| Water immersion rinse (optional) | 100 ± 15F | 3 to 5 minutes |
| Alkaline Clean Brulin 815 GD per BAC 5749 | 140 ± 5F | 20 to 40 minutes |
| Water immersion rinse | 100 ± 15F | 3 to 5 minutes |
| Water Spray Rinse | Ambient | NA |
| Turco 5578 Alkaline Etch (80% concentration) | 190 ± 5F | 15 to 20 minutes |
| DI Water Immersion Rinse | Ambient | 3 to 5 minutes |
| $HNO_3$ Desmut (35% concentration) | 150 ± 5F | 3 to 4 minutes |
| DI Water Immersion Rinse with Agitation | Ambient | 3 to 5 minutes |
| DI Water Spray Rinse | Ambient | NA |
| Verify parts are water break free for greater than 60 seconds | | |

BOECLENE desmutting can replace the $HNO_3$. the composition and use of BOECLENE is described in U.S. Pat. No. 4,614,607, which we incorporate by reference.

While we have described preferred embodiments, those skilled in the art will readily recognize alterations, variations, and modifications, which might be made without departing from the inventive concept. Therefore, interpret the claims liberally with the support of the full range of equivalents known to those of ordinary skill based upon this description. The examples illustrate the invention and are not intended to limit it. Accordingly, define the invention with the claims and limit the claims only as necessary in view of the pertinent prior art.

We claim:

1. A method for promoting adhesion between a metal and an organic matrix resin, comprising the step of:
    coating the metal with an effective amount of a Si—Y mixed metal sol to produce a sol-gel film on the bonding surface of the metal that promotes adhesion between the metal and the resin, wherein the ratio of Si:Y in the sol is in the range from about 10:1 to 80:1.

2. The method of claim 1 further comprising the steps of pretreating the metal to obtain a clean, active surface by:
    (a) degreasing;
    (b) immersing in alkaline cleaner;
    (c) etching in alkaline; and
    (d) desmutting.

3. A coated metal product obtained by the process of:
   (a) pretreating the metal to obtain a clean, active surface by:
      (i) degreasing;
      (ii) immersing in alkaline cleaner;
      (iii) etching in alkaline; and
      (iv) desmutting; and
   (b) coating the metal with an effective amount of a Si—Y mixed metal sol to produce a sol-gel film on the bonding surface of the metal that promotes adhesion between the metal and the resin, wherein the ratio of Si:Y in the sol is in the range from about 10:1 to 80:1.

4. A method for enhancing adhesion of a metal surface, comprising the steps of:
   (a) cleaning and activating the surface;
   (b) applying a mixed metal sol made from an yttrium alkoxide and an organosilane to the surface to form a surface coating;
   (c) drying the coating to form a sol-gel film on the surface, the film forming a metal-to-organic interface to increase adhesion of organic adhesives or resins to the metal; and
   (d) applying a resin over the film,
      wherein the ratio of Si:Y is in the range from about 10:1 to 80:1.

5. The method of claim 4 wherein the metal is titanium or a titanium alloy.

6. The method of claim 4 wherein the yttrium alkoxide covalently bonds to the metal and the organosilane covalently bonds to the resin.

7. A sol coated metal, comprising a mixed metal organosilane/yttrium alkoxide sol-gel film covalently bonded to the metal, wherein the ratio of Si:Y is in the range from about 10:1 to 80:1.

8. A sol containing silicon and yttrium compounds, the sol being suitable for surface treatment of a metal for improving adhesion between the metal and an organic matrix resin or adhesive, comprising:
   (a) an effective amount of yttrium alkoxide in a carrier to form a sol, the yttrium alkoxide covalently bonding to the metal to form a metal-to-organic interface on the metal surface;
   (b) an effective a amount of an orgnosilane coupling agent incorporated in the sol for covalently bonding with the resin of the adhesive; and
   (c) optionally, a hydrolysis rate stabilizer for the yttrium alkoxide, wherein the ratio of Si:Y is in th range from about 10:1 to 80:1.

9. A hybrid laminate, comprising, in alternating layers:
   (a) a metal foil coated with a Si—Y sol-gel film, the film providing adhesion enhancement, and;
   (b) a fiber-reinforced organic matrix resin adhered to the metal through the film.

10. The laminate of claim 9 wherein the film is made using the sol defined in claim 8.

11. An adhesively bonded assembly, comprising:
    (a) at lest two parts aligned to define a bond line;
    (b) a sol-gel film on the face of each part in registration with the bond line, the film comprising a mixture of an yttrium alkoxide and an organosilane;
    (c) an adhesive connecting the parts along the bond line while interfacing with the sol-gel film.

12. The assembly of claim 11 Wherein the sol-gel film is made using the sol of claim 8.

13. The assembly of claim 12 Wherein the parts are metal wherein the metal includes titanium.

* * * * *